United States Patent [19]

Tabei

[11] Patent Number: 4,644,404
[45] Date of Patent: Feb. 17, 1987

[54] SOLID-STATE IMAGE PICKUP DEVICE AND MANUFACTURING METHOD THEREOF

[75] Inventor: Masatoshi Tabei, Kaisei, Japan

[73] Assignee: Fuji Photo Film Co., Ltd., Kanagawa, Japan

[21] Appl. No.: 683,610

[22] Filed: Dec. 19, 1984

[30] Foreign Application Priority Data

Dec. 23, 1983 [JP] Japan ................. 58-242186

[51] Int. Cl.⁴ .............................................. H04N 3/14
[52] U.S. Cl. .................. 358/213; 358/213.11; 358/213.29
[58] Field of Search ............. 358/213, 209, 212; 357/24 LR

[56] References Cited

U.S. PATENT DOCUMENTS 4,400,734 8/1983 Davy ................................. 358/163

OTHER PUBLICATIONS

"MOS Area Sensor: Part I—Design Consideration and Performance of an n-p-n Structure 484×384 Element Color MOS Imager" IEEE Transactions on Electron Devices, vol. ED-27, No. 8, pp. 1676-1681 (1980) by Norio Koike.

Primary Examiner—Robert G. Lev
Attorney, Agent, or Firm—Birch, Stewart, Kolasch & Birch

[57] ABSTRACT

A solid-state image pickup device includes a semiconductor structure, a photosensitive cell array formed on the semiconductor structure and having a plurality of photosensitive cells, and a shift register formed on the semiconductor structure for selectively driving a plurality of photosensitive cells of the cell array to cause pixel signals to be produced therefrom. The shift register includes a plurality of register stages associated with the cell array, and two sets of an initiator circuit and a terminator circuit, each set being arranged at the ends of the plurality of register stages. Interconnections between the plurality of register stages, and selective connections between the two sets of the initiator and terminator circuits and the first and last stages of the plurality of register stages are formed in manufacturing processes on the semiconductor structure in accordance with a direction in which the shift register is to be driven in shifting operation.

A method of manufacturing the solid-state image pickup device is also provided.

4 Claims, 11 Drawing Figures

VSR/HSR
VERTICAL/HORIZONTAL SHIFT REGISTER

Fig. 8 VSR/HSR
Vertical/Horizontal Shift Register

SOLID-STATE IMAGE PICKUP DEVICE AND MANUFACTURING METHOD THEREOF

BACKGROUND OF THE INVENTION

1. Field of the Invention

The present invention relates to an image pickup, device, and, in particular, to a solid-state image pickup device of the type which comprises image pickup or photosensitive cells arranged in a one-dimensional or two-dimensional array and which produces a current associated with generated photocarriers, and a method of manufacturing the solid-state image pickup device.

2. Description of the Prior Art

A two-dimensional solid-state image pickup device comprising a photosensitive cell array has been well known in which photosensitive cells such as photodiodes are arranged to form a two-dimensional array having horizontal lines and vertical columns. Along at least one of the horizontal lines and vertical columns, the photosensitive cells involved are sequentially selected by a shift register to produce pixel signals therefrom. Such devices in which shift registers are utilized for accessing cells in the horizontal and vertical directions are collectively called an MOS-type image pickup device. Specifically, a device in which a shift register is used in association with the vertical direction so as to transfer electric charge in the horizontal direction is referred to as a charge priming device (CPD).

When reading out a pixel signal in the raster scanning fashion from a two-dimensional image pickup device including shift registers for selecting a photosensitive cell in a two-dimensional array, the direction for reading out the cells is uniquely defined for the device depending on the shift register specified for accessing the photosensitive cells.

This restriction causes the following problem in a camera comprising a couple of solid-state image pickup devices.

A camera having such twins of image pickup devices has an advantage that a higher resolution can be developed when compared with a camera utilizing a single image pickup device, moreover, it does not have a drawback that a faulty color signal appears on an edge of an image of an object having a great difference in luminance due to the special color separation, which takes place when a single image pickup device is used.

In the past, however, since the direction for reading pixel signals in a two-dimensional image pickup device was uniquely fixed to the device, identical, orthoscopic images of an object must be formed on the image pickup arrays of two image pickup devices. For this purpose, a prism in which total reflection is developed has been adopted to obtain the orthoscopic image.

The prism, however, has a drawback that it is complex in its shape and has a heavy weight. To eliminate such a prism, it has been considered that a mirror image of an object is established in two image pickup devices by use of a beam splitter, and that thereafter these mirror images are converted into video signals representative of two orthoscopic images of the object in a certain method. In this case, for example, a buffer is required to store the pixel signals developed from the two image pickup devices for each horizontal scanning line and to read out the stored signals in the reversed sequence to the signal storing sequence. Alternatively, it must be devised that the pixel signals obtained from two image pickup devices are stored on a magnetic recording medium without any modification to be conducted on the signals, and that the recorded signals originating from one of the two image pickup devices are read out from the recording medium in the reverse direction to the storing direction.

Such means for inverting images may, however, be dispensed with, if an image pickup device is available from which picture element signals indicative of an orthoscopic image are produced when a mirror image of an object is formed on the photosensitive array thereof. It is therefore required to utilize a two-dimensional image pickup device which allows the video signals of an orthoscopic image to be produced on the basis of the mirror image information stored in such image pickup cells. However, such an image pickup device for inversely reading mirror image information is required to include read shift registers for such read operations which are wired in electric connection specific to the read operation.

In more detail, in order to appropriately read out mirror image signals in the reverse direction, it is required to enable either one of the vertical and horizontal shift registers in its reverse direction, which is opposite to the direction in which signals of an orthoscopic image is produced. In the device for inversely reading out mirror image signals, the electrical wiring connecting the respective stages of the shift register is also reversed to that involved in a device for reading out an orthoscopic image, with an initiator and a terminator connected with the first and last stages thereof, respectively, exchanged in position as compared with normal devices. Consequently, the solid-state image pickup device for reading out inversed mirror image information has to be manufactured by using a mask of a circuit pattern dedicated to the reverse read operation.

That is, in order to manufacture above-stated image pickup device, a special mask pattern other than that for a solid-state image pickup device for reading out orthoscopic image signals is required in separate manufacturing processes. Since the demand for such an image pickup device is less than that for the image pickup device for reading out orthoscopic image signals, the special pattern and dedicated manufacturing process cause the device price to soar and to complicate the management for manufacturing such devices.

SUMMARY OF THE INVENTION

It is therefore an object of the present invention to provide a solid-state image pickup device and a manufacturing method thereof which remove the drawbacks of the prior art described above, and in which both a solid-state image pickup device for reading out orthoscopic image information and one for reversely reading out mirror image information can be manufactured in processes which are not sophisticated.

In accordance with the present invention, there is provided a solid-state image pickup device comprising a semiconductor structure, a photosensitive cell array having a plurality of photosensitive cells formed on the semiconductor structure, and shift register means for selectively driving a plurality of photosensitive cells of the cell array formed on the structure to cause pixel signals to be produced therefrom, said shift register means including a plurality of register stages associated with the photosensitive cell array, and two pairs of an initiator circuit and a terminator circuit, each pair being arranged respectively at the ends of said plurality of register stages, wherein interconnections between said plurality of register stages, and selective connections between the two pairs of initiator and terminator circuits and first and last stages of said plurality of register stages are formed on the structure according to the direction of the shifting operation to be performed in the shift register.

The solid-state image pickup device is manufactured in a method of manufacturing a solid-state image pickup device formed on a semiconductor structure, said image pickup device comprising a photosensitive cell array including a plurality of photosensitive cells, and shift register means for driving a plurality of photosensitive cells of the cell array to cause pixel signals to be produced therefrom, said method comprising; a first step of preparing a semiconductor substrate, a second step of forming on said substrate the photosensitive cell array, a plurality of register stages included in shift register means, and two pairs of an initiator circuit and a terminator circuit, each pair being arranged respectively on the ends of said plurality of register stages, and a third step of forming interconnections between said plurality of register stages, and selective connections between the two pairs of initiator and terminator circuits and first and last stages of said plurality of register stages in accordance with a direction of the shifting operation to be performed in said shift register means.

BRIEF DESCRIPTION OF THE DRAWINGS

The objects and features of the present invention will become more apparent from the consideration of the following detailed description taken in conjunction with the accompanying drawings in which:

FIGS. 7, 8 and 9 depict other alternative embodiments of the present invention shown correspondingly to FIGS. 4, 5 and 6.

DESCRIPTION OF THE PREFERRED EMBODIMENTS

Embodiments of the present invention will be described by referring to the accompanying drawings.

Figure 1:
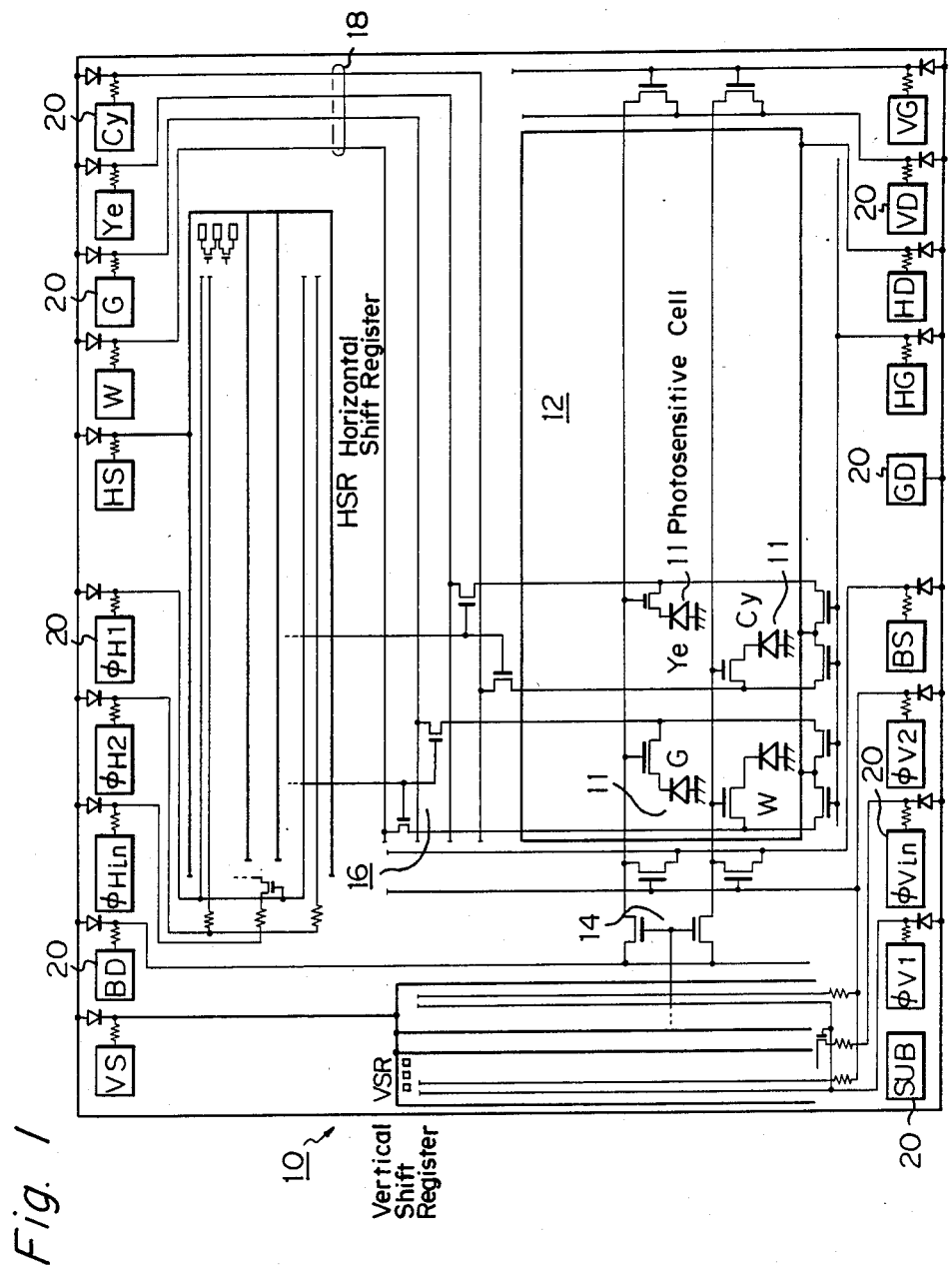
FIG. 1 is a plan view conceptually illustrating a circuit pattern array applied to an MOS-type two-dimensional solid-state image pickup device.

FIG. 1 illustrates a conceptual circuit pattern array in a semiconductor chip 10 implementing an MOS-type two-dimensional solid-state image pickup device. According to this circuit diagram, photosensitive cells 11 such as photodiodes are disposed to form a two-dimensional array in order to configure an image pickup cell array 12. In this embodiment, the array 12 comprises 242 horizontal scanning lines in the vertical direction and 256 picture elements, or pixels, in the horizontal direction. For each picture element in this example, a mosaic color separation filter including white (W), green (G), yellow (Ye), and Cyan (Cy) segments is disposed on a illuminated surface of the image pickup cell 12.

For each cell 11, a horizontal line is selected by a vertical shift register VSR through a horizontal line select gate 14, while a vertical column is specified by a horizontal shift register HSR via a vertical column select gate 16. The semiconductor chip 10 has contact pads 20 on four corners thereof for receiving power such as VS, BD, HS, GN, BS, and SUB.

A current associated with light incident to a cell is obtained in the form of a pixel signal for each separated color over a video signal line 18. This operation is accomplished by supplying driving clocks $\phi V1$ and $\phi V2$ and a driving pulse $\phi Vin$ to the vertical shift register VSR through associated contact pads 20, and by delivering driving clocks $\phi H1$ and $\phi H2$ and a driving pulse $\phi Hin$ to the horizontal shift register HSR via the respective contact pads. Separated color signals are delivered from the associated pads W, G, Ye, and Cy to an external circuit. The contact pads HG, HD, VD, and VG are provided as the test driving input terminals.

Figure 2:
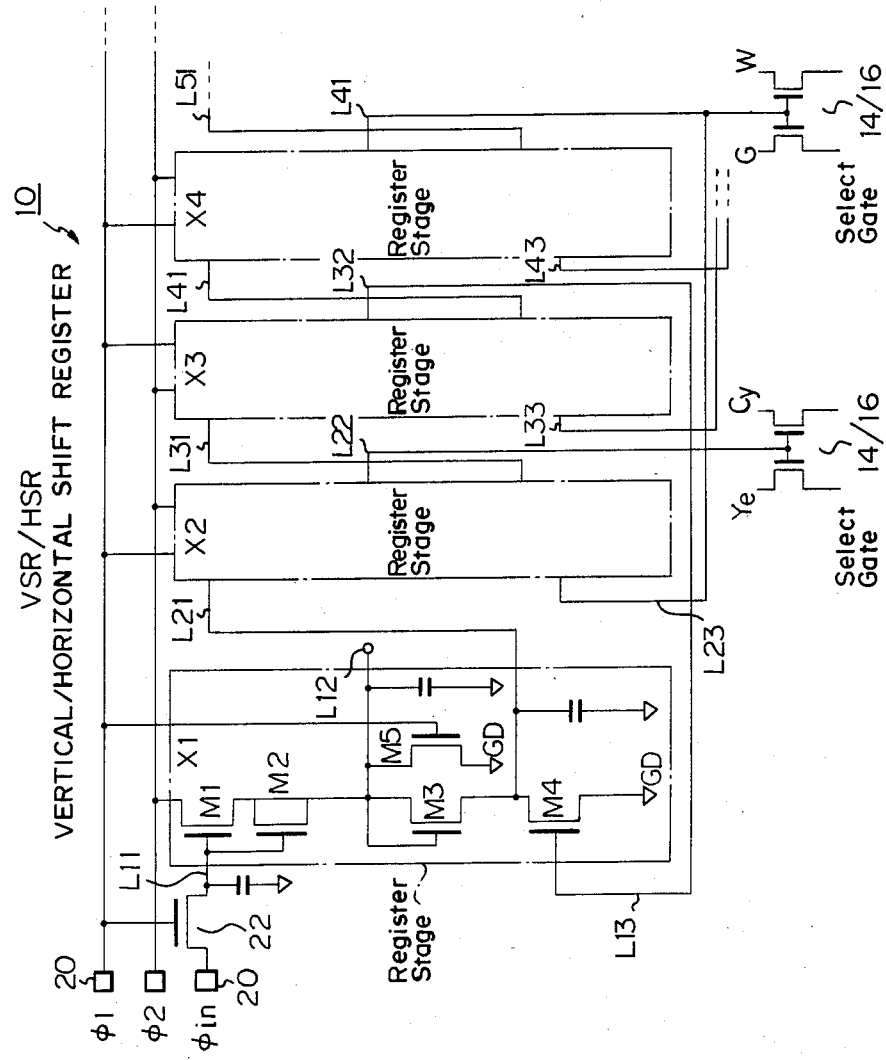
FIG. 2 is a schematic circuit diagram depicting a part of the circuit configuration of a vertical shift register and a horizontal shift register employed in the image pickup device shown in FIG. 1.

The vertical and horizontal shift register VSR and HSR are configured with a plurality of register stages X1, X2, and so forth, as partially depicted in FIG. 2. Since the register stages have the same configuration, only the first stage X1 thereof will be described in detail.

Figure 3:
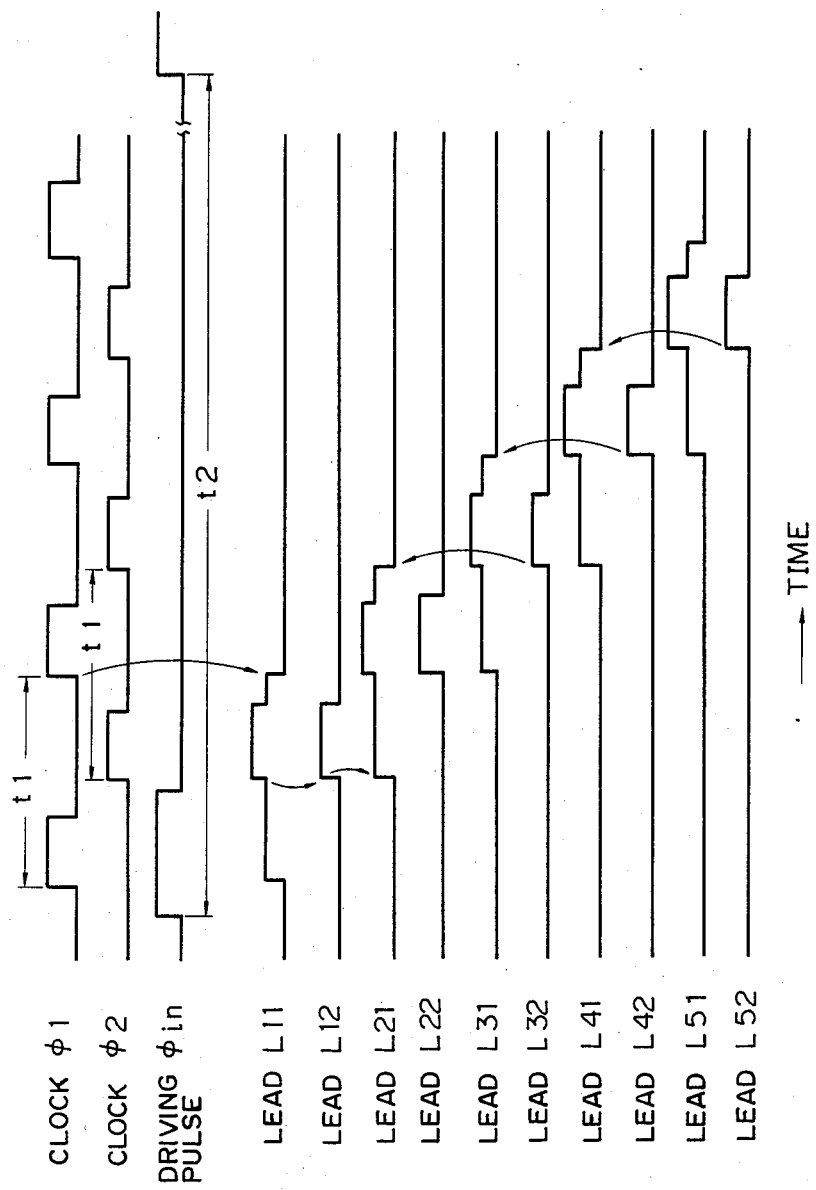
FIG. 3 is a timing chart useful for understanding the operations of the circuit depicted in FIG. 2.

For the vertical shift register VSR, the contact pads 20, namely, $\phi1$, $\phi2$, and $\phi in$ are supplied with the driving clocks $\phi V1$ and $\phi V2$ and the driving pulse $\phi Vin$, respectively. For the horizontal shift register HSR, the driving clocks $\phi H1$ and $\phi H2$ and the driving pulse $\phi Hin$ are delivered to the respective contact pads 20, $\phi1$, $\phi2$, and $\phi in$. The waveforms of the driving clocks $\phi1$ and $\phi2$ and driving pulse $\phi in$ are depicted in FIG. 3. In the NTSC standard television format, for example, the time interval t1 for the pulses $\phi1$ and $\phi2$ is 63.61 $\mu s$ and the time interval t2 for the pulse $\phi in$ is 16.67 ms with respect to the vertical shift register VSR; whereas, the time interval t1 is 140 ns and t2 is 63.61 $\mu s$ for the horizontal shift register.

An initiator 22 (a single transistor in the illustrated embodiment) is disposed between the first register stage X1 and the contact pad $\phi in$. In each register stage, for instance, in X1, five MOS devices, comprising three switching transistors M1, M4, and M5, a bootstrap capacitor M2, and a diode M3 are arranged as illustrated in FIG. 2. As can be seen from this configuration, two stages form a functional set or unit. In the former stage of each set, that is, in an odd-numbered stage, the clocks $\phi1$ and $\phi2$ are fed to the transistors M1 and M2, respectively; while, in the latter stage thereof, namely, in the even-numbered stage, the clocks $\phi1$ and $\phi2$ are delivered to the transistors M2 and M1, respectively. An output from each stage, for example, L12 is fed back to a gate electrode, for instance, L13 of the transistor M4 in the second last stage therebefore. Outputs from the even-numbered stages such as L22 and L42 drive the select gate 14 or 16.

The operation of these components will be described by referring to the timing chart of FIG. 3. When the clock $\phi1$ is set to the high level with the driving pulse $\phi$in remaining at the high level, a gate electrode L11 of the transistor M1 is driven to the high level through the initiator 22 so as to charge the capacitor M2. When the clock $\phi2$ goes high in this case, the capacitor M2 is set to, and remains at, the high level for the time period in which the clock $\phi2$ is held at the high level. Consequently, a part of the stored electric charge flows on a lead L11, and a lead L12 is thus set to the high level for the same time period as depicted in FIG. 3. When set to the high level, the outputs L22 and L42 from the even-numbered stages drive the select gate 14 or 16.

In response to the high level of the next clock $\phi1$, the transistor M5 is rendered conductive to reset the output L12 and the like, which is in turn fed back to the transistor M4 in the second last stage, which is then reset to its initial state.

The shift register is driven in the manner described above so as to shift the driving pulse for the gate 14 or 16. Next to the last stage, a terminator 24 (see FIG. 4) having almost the same configuration as each register stage is connected thereto.

Figure 4:
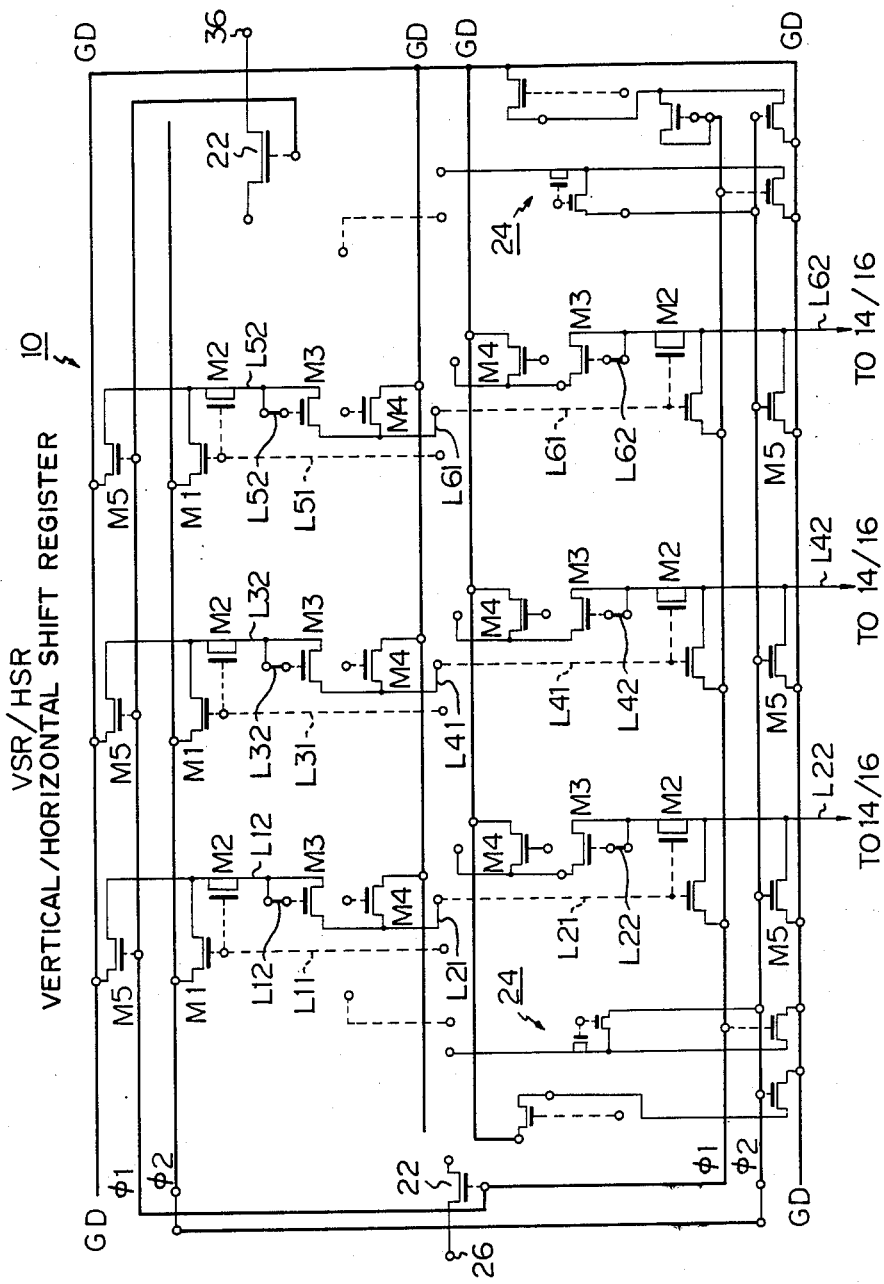
FIG. 4 is a conceptual plan view of the arrangement and configuration of the shift registers of FIG. 2 constructed on a chip in accordance with an embodiment of the present invention, illustrating the portions shared between the solid-state image pickup devices for reading out orthoscopic image signals and for reading out inverted mirror image signals.

FIG. 4 is a conceptual schematic diagram of the configuration of the shift register implemented on the chip 10 in accordance with the embodiment of the present invention. As will be described later, this is a conceptual plan view of the arrangement and configuration of the shift register on the chip 10 of FIG. 2, illustrating the sections common to both a solid-state image pickup device for reading out orthoscopic image signals and one for reading out mirror image signals reversely. Consequently, as will be also cleared later, there does not necessarily exist a step for utilizing such a circuit pattern in the manufacturing process of the chip 10. Although the circuit pattern of FIG. 4 is shared among the solid-state image pickup devices for reading out orthoscopic image signals and for reading out inverted mirror image signals, the circuit elements are designated with reference numbers and symbols associated with those used in FIG. 2 for a case of the shift register stage of an image pickup device for reading out orthoscopic image signals so as to simplify the description.

A register stage comprising the elements M1 to M5 in FIG. 2 is arranged at the respective locations above and below a ground line (GD) illustrated horizontally in the central part of FIG. 4. That is, the odd-numbered stages are placed in the upper half of the circuit program, while the even-numbered stages are located in the lower half thereof.

A part of each circuit element and the interconnecting section between both parts are implemented by forming three layers on the surface of the semiconductor chip 10. In this embodiment, an N+ diffusion layer indicated by the thin solid line is formed next to a semiconductor substrate made of silicon, for example. On this layer, there is provided an insulation layer made of such as silicon oxide, and a polycrystalline silicon layer indicated by dot lines is formed thereon. Furthermore, a metal evaporation layer is provided thereabove with an insulation layer formed therebetween. The metal evaporation layer is indicated by bold solid lines. Interconnecting points between layers having the different levels are represented with small circles.

Descriptions will be given in more detail in accordance with the manufacturing process order. The N+ diffusion layer is established first on the primary surface of the semiconductor substrate, then the circuit elements M1 to M5 and the associated interconnections therebetween such as a part of L12 and the output section L22 to the select gate 14 or 16 are formed as indicated with thin solid lines. A pair of the initiator 22 and the terminator 24 is disposed at the respective ends of the shift register.

An insulation layer is produced thereon in order to form a polycrystalline layer by use of the circuit pattern represented by dot lines. That is, elements such as the connection L11 to a portion associated with the gate of each functional constituent are prepared. The second insulation layer is formed thereon. The processes described hereabove are common to the solid-state image pickup devices for reading out orthoscopic image signals and for reading reversed mirror image signals. Namely, the same manufacturing processes are conducted by using the mask pattern common to both devices.

In the next process for forming a metal evaporation or deposition layer thereon, the mask pattern slightly varies between the image pickup device for reading out orthoscopic image signals and that for reading out mirror image signals reversely. The portions common to both types of device are illustrated with bold lines in FIG. 4 and include the rest of the constituents such as the ground line GD, clock lines $\phi1$ and $\phi2$, connecting wire L12, and the like. The portions unique to the device for reading out orthoscopic image signals are indicated with bold dot-chain line in FIG. 5, while those unique to the device for reading out inverted mirror image signals are represented in the same way in FIG. 6. It should be noted that such representation is adopted only for simplicity of description, that is, those elements indicated with the bold solid and dot-chain lines can be produced by conducting the metal evaporation with the same mask pattern used.

Figure 5:
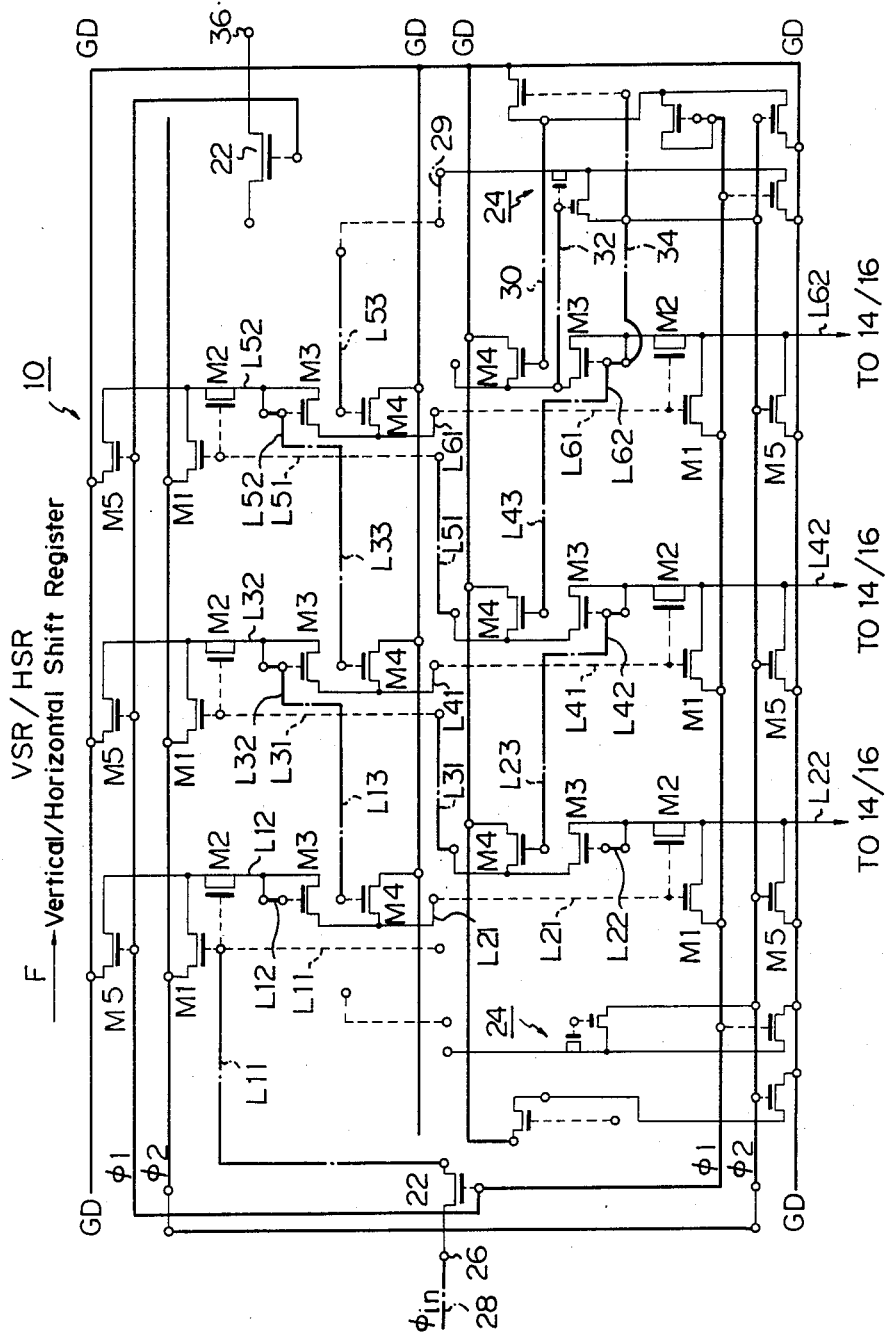
FIG. 5 depicts the arrangement and configuration of the shift registers in a solid-state image pickup device for reading out orthoscopic image signals finally completed into a circuit in accordance with the embodiment of FIG. 4.

Referring to FIG. 5, when manufacturing the device for reading out orthoscopic image signals in response to the stepping or shifting operation of the register in the forward direction indicated by F, the metal evaporation or deposition pattern is configured so that a connecting wire 28 for the pulse input $\phi$ is formed to be connected to a connecting point 26 and the connecting wire L11 is formed from the initiator 22 in the left end portion of this circuit diagram to the input disposed in the upper-left corner thereof. In this case, the initiator 22 in the right end portion is not provided with a connecting circuit.

For each stage, the remaining circuit elements, such as the feedback routes L23, L32, etc., to the second last register stages, respectively, and the input wire L31 and the like from an even-numbered stage to an odd-numbered stage of the next set of functional stages, are also formed in this metal evaporation or deposition process. Consequently, the constituents such as the connecting wires L11 and L21 are made of polycrystalline layers not to be brought into contact with these portions. In this manner, the metal evapolation pattern is configured so as to allow the upper and lower stages to be driven in sequence in shifting operation in the direction of the arrow F in the figures.

This metal evaporation process also forms the connections 29, 30, 32, and 34 from the final or right-most set of stages to a terminator 24 disposed on the right end. Any connecting wire is not created for the terminator 24 on the left end in this case. FIG. 4 and subsequent figures each illustrates only three sets of register stages because of simplification of the description, that is, several stages should be naturally prepared corresponding to the number of the horizontal scanning lines or picture elements in an actual case.

Figure 6:
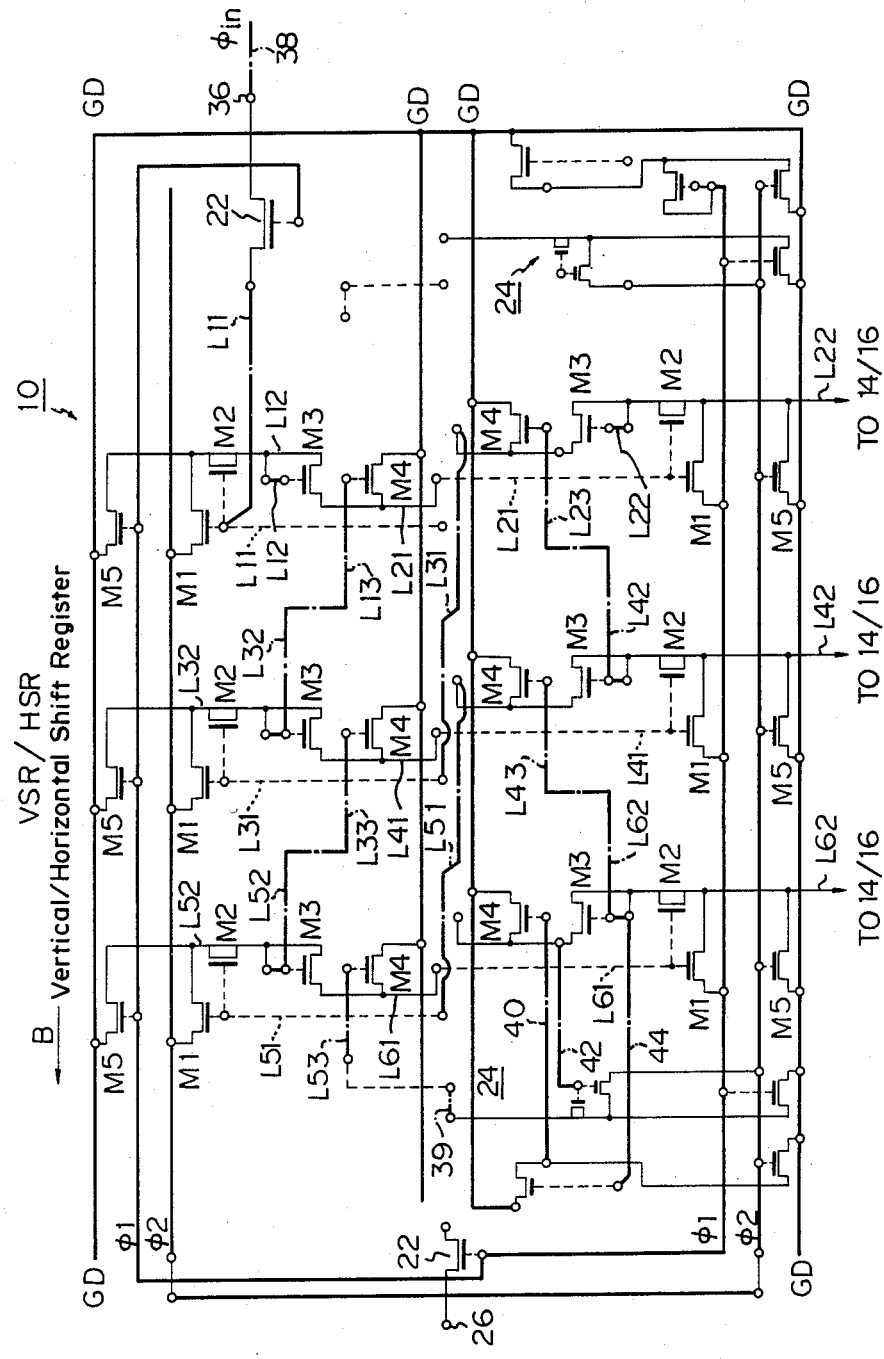
FIG. 6 illustrates the arrangement and configuration, in a similar manner as for FIG. 5, of a solid-state image pickup device for reading out inverted mirror image signals in accordance with the embodiment of FIG. 4.

FIG. 6 illustrates a schematic circuit diagram of a solid-state image pickup device for reading out mirror image signals reversely. Referring to this circuit diagram, for the device in which the stepping operation of the shift register takes place in the reverse direction denoted by B, the metal evaporation pattern is configured so that a connecting wire 38 for the pulse input $\phi$in is formed to be connected to a connecting point 36 and the connecting wire L11 is done to the input of the first stage or the upper-right stage. In this case, no connecting circuit is formed for the initiator 22 disposed on the left end.

For each stage, the remaining constituents, such as the feedback routes L23 and L32 to the second last register stages, respectively, and the input line L31 or the like from an even-numbered stage to an odd-numbered stage of the next set of stages, are also established in this metal evaporation process. These portions are not brought into contact with the connecting wires L11 and L21 and the like made of polycrystalline layers. As described hereabove, the metal evaporation pattern is established so as to allow the upper and lower stages of the register to be clocked in shifting sequentially in the direction marked with the arrow B.

This metal evaporation process also forms the connections 39, 40, 42, and 44 from the last stage, i.e., the left-most stage to the terminator 24 disposed on the left end. In this case, the terminator 24 on the right end is not provided with a connecting wire.

The circuit patterns unique to the devices for reading out orthoscopic image signals and for reading out inverted mirror image signals are manufactured, respectively by using the different wiring patterns for the upper-most metal evaporation layers as described above, while the other manufacturing processes and mask patterns are commonly used for both devices, thereby minimizing the number of processes and kinds of mask patterns for manufacturing these two types of image pickup devices.

Figure 7:
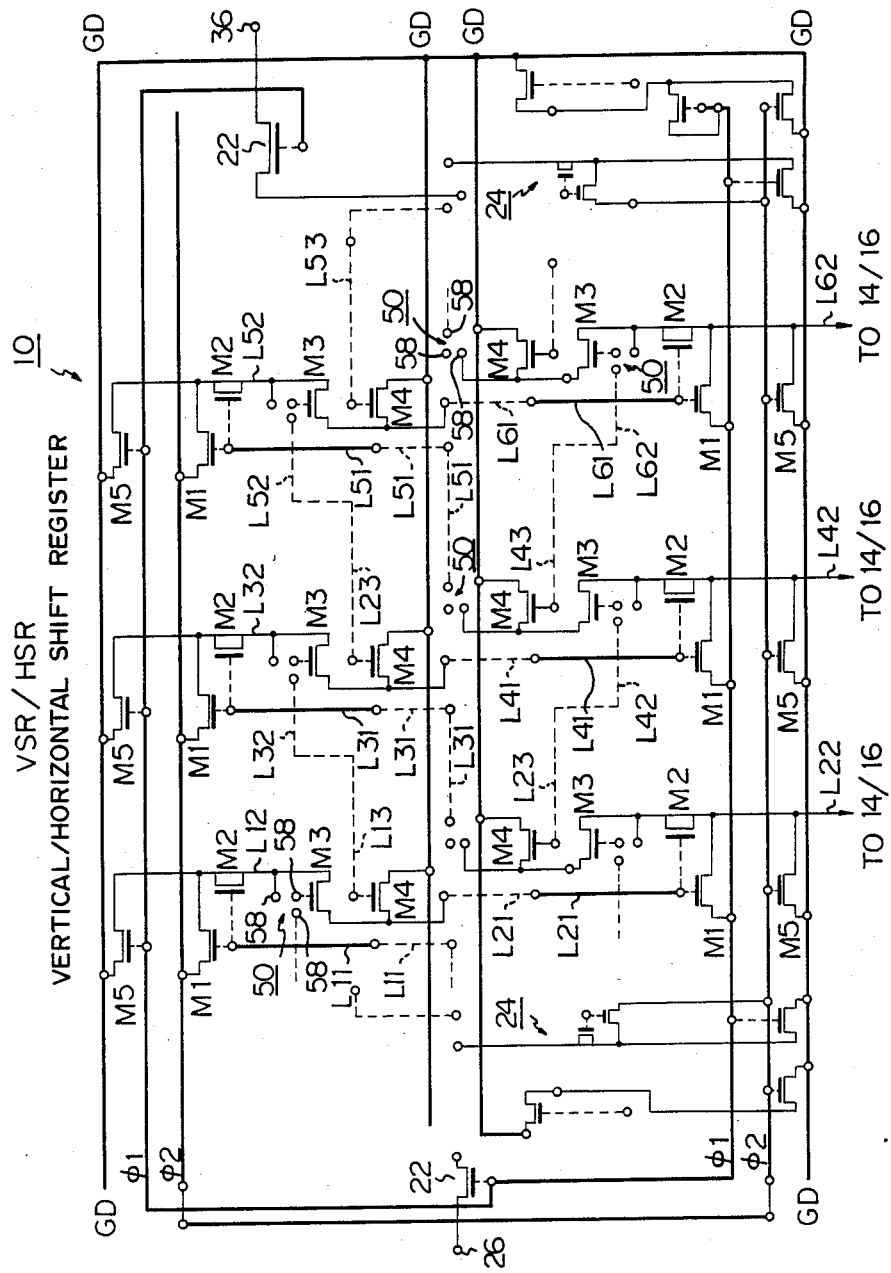
Figure 8:
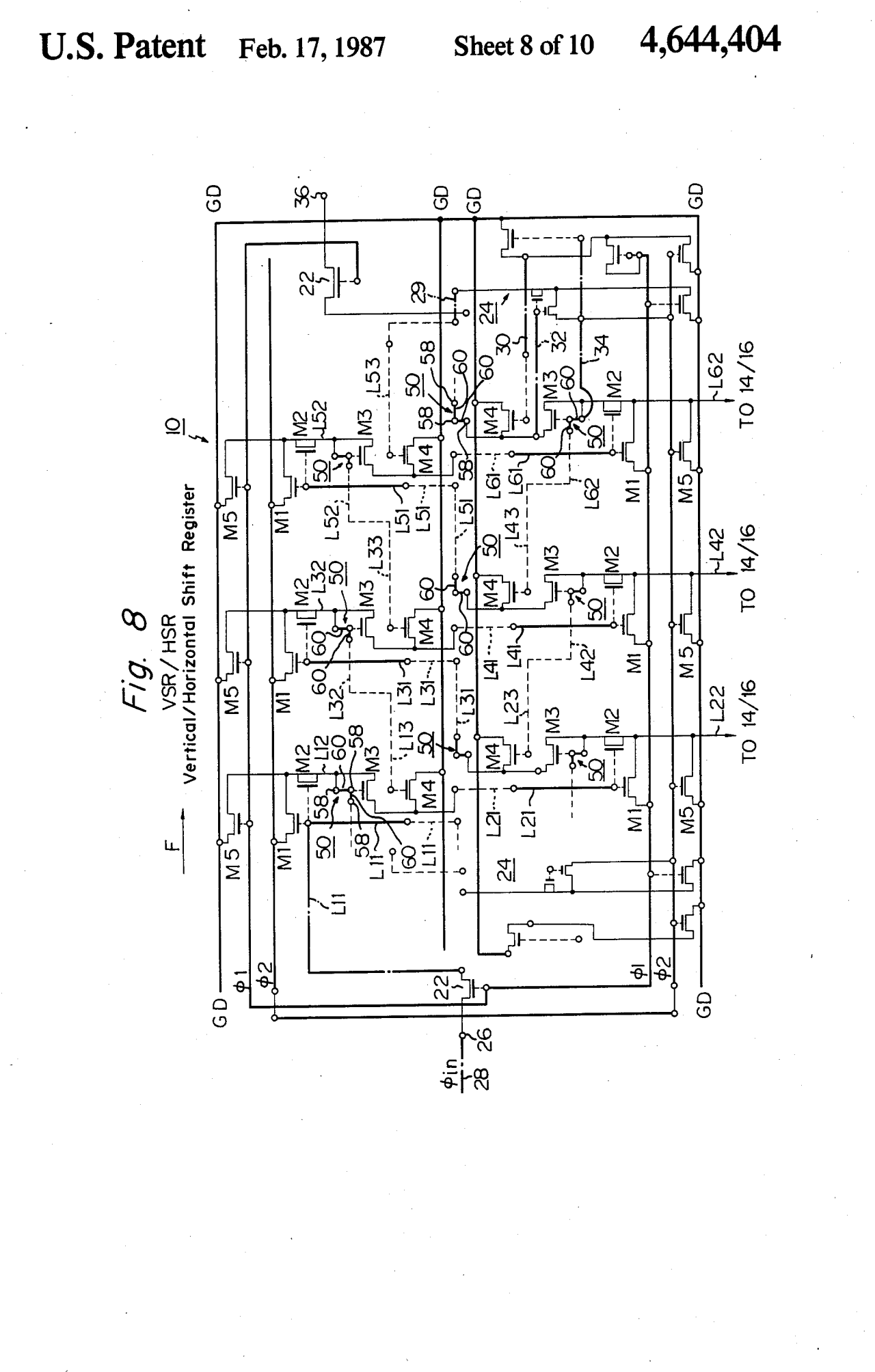
Figure 9:
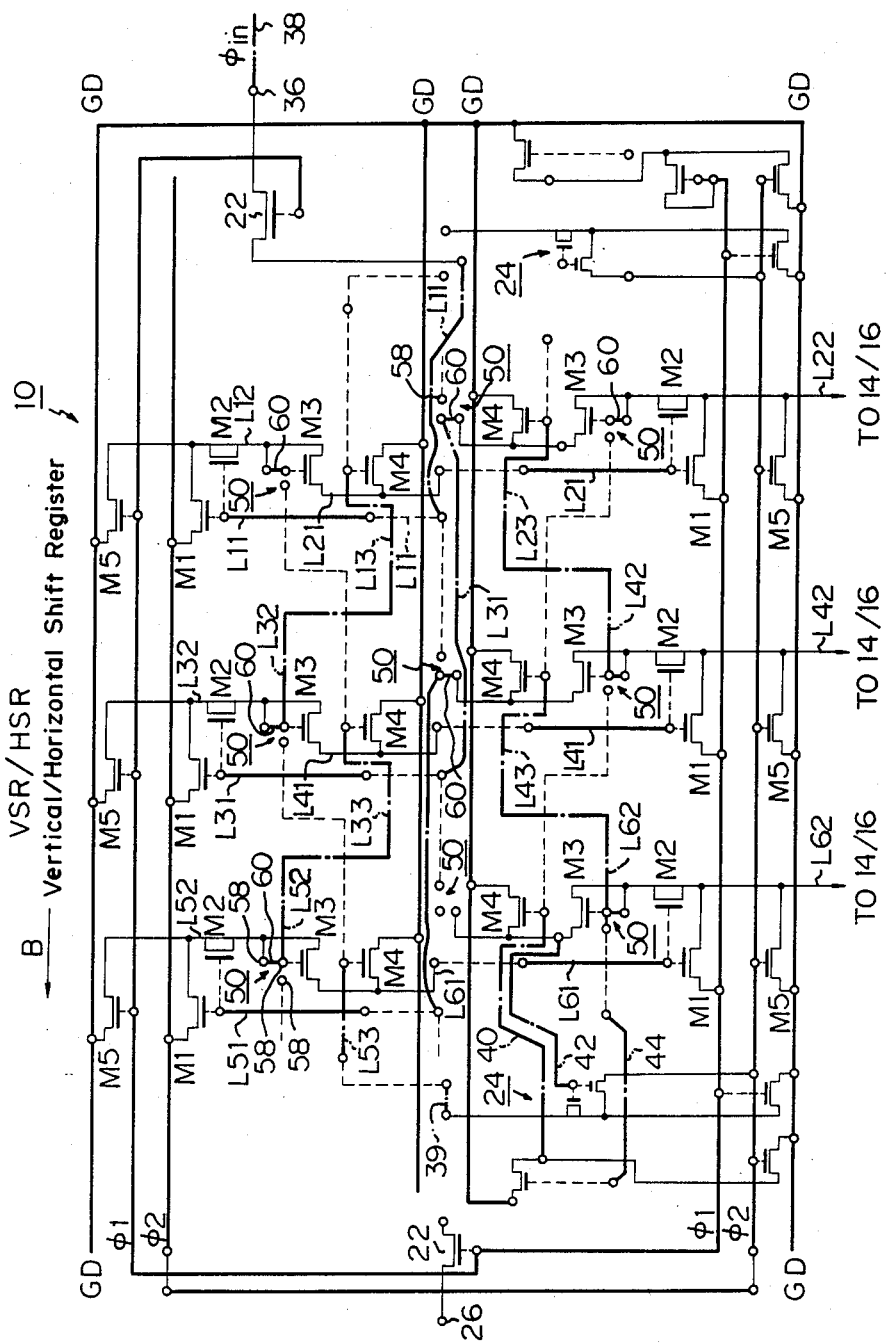

FIGS. 7, 8 and 9 illustrate other alternative embodiments of the present invention in which the same circuit elements as depicted in FIGS. 4, 5 and 6, respectively, are designated with the same reference numbers or symbols. Only the differences therebetween will be described in detail hereinafter.

Although the basic idea of these embodiments is also the same as that of the before-stated embodiment of the present invention, that is, only the circuit pattern for the metal evaporation varies between the image pickup device for reading out orthoscopic image signals and the device for reading out inverted mirror image signals, the direction of the stepping operation in the register is changed mainly in accordance with the contact pad connections.

Referring to FIG. 7, the portions made by the metal evaporation, such as connections of the input wires L11, L21, and L31 to the associated stages, are disposed at the different locations as compared with FIG. 4. In FIG. 7, for instance, a part of the vertical portion of the connecting wire L31 is made of a metal layer, while a part of the vertical portion is formed with a polycrystalline layer. A feedback route, for example, from the output L32 of a stage to the input L13 of the second last stage is constructed by forming a polycrystalline layer.

Figure 10A:
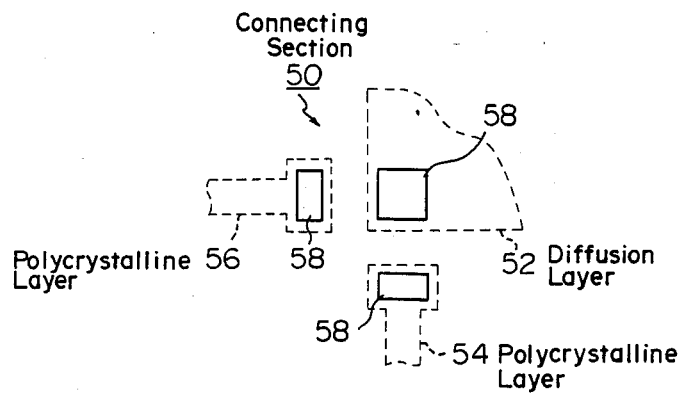
FIGS. 10A and 10B are plan views of connecting sections in the embodiment of FIG. 7, illustrating the states before and after the metal evaporation, respectively.
Figure 10B:
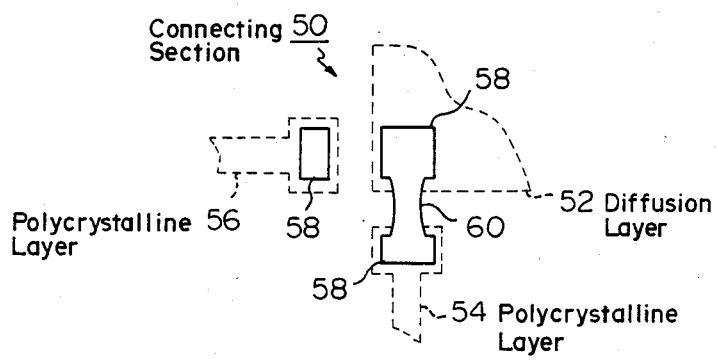

As can be seen from FIG. 10A illustrating the state of a connecting section 50 before the metal evaporation, a diffusion layer 52 and two polycrystalline layers 54 and 56 are grown on the semiconductor substrate, and contact pads 58 for connecting these layers 52, 54, and 56 to the metal evaporation layer are exposed through the upper-most insulation layer. As illustrated in FIG. 10B, when the metal layer is evaporated or deposited, the contact pads 58 are selectively connected with a connecting section in dependance upon the mask pattern used. Naturally, these three pads 58 may be completely connected to each other, only two pads may be connected, or they may be electrically independent to each other.

The diffusion and polycrystalline layers are formed before the metal evaporation layer in the same way as for the embodiment described before. Then a circuit pattern of the metal evaporation layer is manufactured by use of the different metal evaporation layer masks depending on the processes for manufacturing the solid-state image pickup devices for reading out orthoscopic image signals and for reading out inverted mirror image signals, respectively.

For the device for reading out orthoscopic image signals, the metal evaporation process creates connections to the initiator 22 on the left end and to the terminator 24 on the right end as depicted in FIG. 8, and all pads 58 of the connecting section 50 are connected by use of the connecting section 60. As described before, for example, a part of the vertical portion of the connecting wire L31 or the like is also formed with a metal layer. The other connections are established in the same way as for the embodiment of FIG. 5. A shift register which performs the stepping operation through register stages in the forward direction as indicated by the arrow F is thus implemented.

For the image pickup device for reading out mirror image signals reversely, the metal evaporation process creates connections to the initiator 22 on the right end and to the terminator 24 on the left end as illustrated in FIG. 9, and the pads 58 of the connecting section 50 are selectively connected by use of the connecting section 60. In this process, a part of the horizontal portion of the connecting wire L31 or the like is formed with the metal layer so as to configure an output line to the next stage. The other connections are established in the same way as for the embodiment of FIG. 6. A shift register which performs the stepping operation of register stages in the reverse direction as indicated with the arrow B is thus manufactured.

In accordance with the present invention, in short, the connections to the initiator and terminator of the shift register, and the other circuits except the interconnections between the input/output wires and reset lines of each register, are formed in the manufacturing process common to the solid-state image pickup device for reading out orthoscopic image signals and that for reading out inverted mirror image signals, while the final process or the process substantially similar thereto varies depending on these two types of image pickup devices.

As described above, the present invention adopts a method in which the circuit connection of the shift register for selecting image pickup cells, formed in the final or substantially close-to-final process, is different between the solid-state image pickup devices of above-mentioned types in the own manufacturing processes thereof, and in which the common processes shared between these two types of image pickup devices are employed preceding the own specific processes described above. This method enables both image pickup devices for reading out orthoscopic image signals and for reversely reading out mirror image signals to be manufactured by use of simplified processes.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A solid-state image pickup device comprising:
   a semiconductor structure;
   a photosensitive cell array formed on said semiconductor structure and having a plurality of photosensitive cells; and
   shift register means formed on said semiconductor structure for selectively driving a plurality of photosensitive cells of said cell array to cause pixel signals to be produced therefrom;
   said shift register means comprising:
   a plurality of register stages associated with said photosensitive cell array; and
   two sets of an initiator circuit and a terminator circuit, each set being arranged at an end of said plurality of register stages;
   said plurality of register stages other than first and last stages thereof each having a connector terminal for establishing a selected interconnection with the connector terminal of an adjacent one of said plurality of register stages in accordance with a direction in which said shift register means is to be driven in a shifting operation;
   the first and last stages of said plurality of register stages each having a connector terminal for establishing a selected connection with the connector terminal on one of said initiator and terminator circuits of one of said two sets of initiator and terminator circuits in accordance with the direction in which said shift register means is to be driven in a shifting operation;
   said initiator and terminator circuits each having a connector terminal for establishing a selected connection with the connector terminal of one of the first and last stages of said plurality of register stages in accordance with the direction in which said shift register means is to be driven in shifting operation.

2. A solid-stage image pickup device according to claim 1 wherein said photosensitive cell array comprises a two-dimensional array having a plurality of photosensitive cells arranged in horizontal lines and vertical columns;
   said shift register means comprising:
   horizontal shift register means for selectively driving the photosensitive cells included in a horizontal line of said two-dimensional array; and
   vertical shift register means for selectively driving the photosensitive cells included in a vertical column of said two-dimensional array;
   the selected interconnections between the connector terminals of said plurality of register stages, and the selected connections between the connector terminals of said two sets of the initiator and terminator circuits and the first and final stages of said plurality of register stages, with respect to at least one of said horizontal and vertical shift register means, being formed on said semiconductor structure in accordance with the direction of shifting operation to be performed in said at least one of said horizontal and vertical register means.

3. A method of manufacturing a solid-state image pickup device including a semiconductor structure, a photosensitive cell array formed thereon and having a plurality of photosensitive cells, and shift register means formed on said structure for selectively driving a plurality of photosensitive cells of said cell array to cause pixel signals to be produced therefrom, comprising:
   a first step of preparing a semiconductor substrate;
   a second step of forming on said substrate said photosensitive cell array, a plurality of register stages included in said shift register means, and two sets of an initiator circuit and a terminator circuit, each set being arranged at the ends of said plurality of register stages; and
   a third step of forming on a structure formed by said second step interconnections between said plurality of register stages, and selective connections between said two sets of the initiator and terminator circuits and first and last stages of said plurality of register stages in accordance with a direction of shifting operation to be performed in said shift register means.

4. A method according to claim 3 wherein said photosensitive cell array comprises a two-dimensional array having a plurality of photosensitive cells arranged in horizontal lines and vertical columns;
   said shift register means comprising:
   horizontal shift register means for selectively driving the photosensitive cells included in a horizontal line of said two-dimensional array; and
   vertical shift register means for selectively driving the photosensitive cells included in a vertical column of said two-dimensional array;
   said third step being conducted at least for one of said horizontal and vertical shift register means.

* * * * *